US007076073B2

(12) United States Patent
Armstrong

(10) Patent No.: US 7,076,073 B2
(45) Date of Patent: Jul. 11, 2006

(54) DIGITAL QUASI-RMS DETECTOR

(75) Inventor: Stephen W. Armstrong, Burlington (CA)

(73) Assignee: Gennum Corporation (CA)

( * ) Notice: Subject to any disclaimer, the term of this patent is extended or adjusted under 35 U.S.C. 154(b) by 576 days.

(21) Appl. No.: 10/125,185

(22) Filed: Apr. 18, 2002

(65) Prior Publication Data

US 2003/0012393 A1    Jan. 16, 2003

Related U.S. Application Data

(60) Provisional application No. 60/284,460, filed on Apr. 18, 2001.

(51) Int. Cl.
*H04R 25/00* (2006.01)

(52) U.S. Cl. .................. 381/321; 381/312; 381/313; 381/317

(58) Field of Classification Search ................ None
See application file for complete search history.

(56) References Cited

U.S. PATENT DOCUMENTS

| 4,113,997 | A | 9/1978 | Horna |
| 4,119,814 | A | 10/1978 | Harless |
| 4,142,072 | A | 2/1979 | Berland |
| 4,187,413 | A | 2/1980 | Moser |
| 4,289,935 | A | 9/1981 | Zollner et al. |
| 4,403,118 | A | 9/1983 | Zollner et al. |
| 4,471,171 | A | 9/1984 | Köpke et al. |
| 4,508,940 | A | 4/1985 | Steeger |
| 4,592,087 | A | 5/1986 | Killion |
| 4,689,818 | A | 8/1987 | Ammitzboll |
| 4,689,820 | A | 8/1987 | Köpke et al. |
| 4,696,032 | A | 9/1987 | Levy |
| 4,712,244 | A | 12/1987 | Zwicker et al. |
| 4,750,207 | A | 6/1988 | Gebert et al. |
| 4,852,175 | A | 7/1989 | Kates |
| 4,868,880 | A | 9/1989 | Bennett, Jr. |

(Continued)

FOREIGN PATENT DOCUMENTS

EP      89101149.6      8/1989

(Continued)

OTHER PUBLICATIONS

Lunner, Thomas and Hellgren, Johan, "A Digital Filterbank Hearing Aid-Design, Implementation and Evaluation", Department of Electronic Engineering and Department of Otorhinolaryngology, University of Linkoping, Sweden, pp. 3661-3664.

(Continued)

*Primary Examiner*—Sinh Tran
*Assistant Examiner*—Phylesha L Dabney
(74) *Attorney, Agent, or Firm*—Jones Day

(57) ABSTRACT

A digital quasi-RMS detector is provided that approximates the time-varying RMS energy of a signal. The digital quasi-RMS detector rectifies the signal and compares the rectified signal with an estimated present energy value of the audio signal. If the difference between the rectified signal and the estimated present energy value is not greater than zero, then the digital quasi-RMS detector multiplies the rectified signal by a first time constant to generate a first filtered signal and sums the first filtered signal with the estimated present energy value to determine the approximate RMS energy. If the difference between the rectified signal and the estimated present energy is greater than zero, however, then the digital quasi-RMS detector multiplies the rectified signal by a second time constant to generate a second filtered signal and sums the second filtered signal with the estimated present energy value to determine the approximate RMS energy.

21 Claims, 4 Drawing Sheets

U.S. PATENT DOCUMENTS

| | | |
|---|---|---|
| 4,882,762 A | 11/1989 | Waldhauer |
| 4,947,432 A | 8/1990 | Topholm |
| 4,947,433 A | 8/1990 | Gebert |
| 4,953,216 A | 8/1990 | Beer |
| 4,989,251 A | 1/1991 | Mangold |
| 4,995,085 A | 2/1991 | Kern et al. |
| 5,027,060 A | 6/1991 | Fraisse |
| 5,027,410 A | 6/1991 | Cummins et al. |
| 5,029,217 A | 7/1991 | Chabries et al. |
| 5,046,102 A | 9/1991 | Zwicker et al. |
| 5,111,419 A | 5/1992 | Morley, Jr. et al. |
| 5,144,674 A | 9/1992 | Meyer et al. |
| 5,189,704 A | 2/1993 | Krauss |
| 5,201,006 A | 4/1993 | Weinrich |
| 5,202,927 A | 4/1993 | Topholm |
| 5,210,803 A | 5/1993 | Martin et al. |
| 5,241,310 A | 8/1993 | Tiemann |
| 5,247,581 A | 9/1993 | Gurcan |
| 5,276,739 A | 1/1994 | Krokstad et al. |
| 5,278,912 A | 1/1994 | Waldhauer |
| 5,347,587 A | 9/1994 | Takahashi et al. |
| 5,376,892 A | 12/1994 | Gata |
| 5,389,829 A | 2/1995 | Milazzo |
| 5,448,644 A | 9/1995 | Pfannenmueller et al. |
| 5,450,268 A | 9/1995 | Phillips et al. |
| 5,479,522 A | 12/1995 | Lindemann et al. |
| 5,500,902 A | 3/1996 | Stockham, Jr. et al. |
| 5,515,443 A | 5/1996 | Meyer |
| 5,524,150 A | 6/1996 | Sauer |
| 5,604,812 A | 2/1997 | Meyer |
| 5,608,803 A | 3/1997 | Magotra et al. |
| 5,613,008 A | 3/1997 | Martin |
| 5,649,019 A | 7/1997 | Thomasson |
| 5,661,814 A | 8/1997 | Kälin et al. |
| 5,687,241 A | 11/1997 | Ludvigsen |
| 5,706,351 A | 1/1998 | Weinfurtner |
| 5,710,820 A | 1/1998 | Martin et al. |
| 5,717,770 A | 2/1998 | Weinfurtner |
| 5,719,528 A | 2/1998 | Rasmussen et al. |
| 5,754,661 A | 5/1998 | Weinfurtner |
| 5,798,848 A | 8/1998 | Martin |
| 5,809,151 A | 9/1998 | Husung |
| 5,815,102 A | 9/1998 | Melanson |
| 5,838,801 A | 11/1998 | Ishige et al. |
| 5,838,806 A | 11/1998 | Sigwanz et al. |
| 5,862,238 A | 1/1999 | Agnew et al. |
| 5,878,146 A | 3/1999 | Anderson |
| 5,896,101 A | 4/1999 | Melanson |
| 5,912,977 A | 6/1999 | Gottschalk-Schoenig |
| 6,005,954 A | 12/1999 | Weinfurtner |
| 6,044,162 A | 3/2000 | Mead et al. |
| 6,044,163 A | 3/2000 | Weinfurtner |
| 6,049,617 A | 4/2000 | Sigwanz et al. |
| 6,049,618 A | 4/2000 | Saltkov |
| 6,108,431 A | 8/2000 | Bachler |
| 6,175,635 B1 | 1/2001 | Meyer et al. |
| 6,198,830 B1 | 3/2001 | Holube et al. |
| 6,236,731 B1 | 5/2001 | Brennan et al. |
| 6,240,192 B1 | 5/2001 | Brennan et al. |
| 6,240,195 B1 | 5/2001 | Bindner et al. |
| 6,272,229 B1 | 8/2001 | Backgaard |
| 6,633,202 B1 * | 10/2003 | Yang et al. .......... 331/57 |
| 6,937,738 B1 | 8/2005 | Armstrong et al. |

FOREIGN PATENT DOCUMENTS

| | | |
|---|---|---|
| EP | 91480009.9 | 7/1992 |
| EP | 93203072.9 | 5/1994 |
| JP | 2-192300 | 7/1990 |
| WO | WO 83/02212 | 6/1983 |
| WO | WO 89/04583 | 5/1989 |
| WO | WO 95/08248 | 3/1995 |
| WO | WO 97/14266 | 4/1997 |

OTHER PUBLICATIONS

Lee, Jo-Hong and Kang, Wen-Juh, "Filter Design for Polyphase Filter Banks with Arbitrary Number of Subband Channels", Department of Electrical Engineering, National Taiwan University, Taipei, Taiwan, Republic of China, pp. 1720-1723.

* cited by examiner

DIGITAL QUASI-RMS DETECTOR

CROSS-REFERENCE TO RELATED APPLICATION

This application claims priority from and is related to the following prior application: Digital Quasi-RMS Detector, U.S. Provisional Application No. 60/284,460, filed Apr. 18, 2001. This application is also related to the following co-pending applications that are commonly owned by the assignee of the present application: Digital Hearing Aid System, U.S. patent application No. [application number not yet assigned], filed Apr. 12, 2002; and Inter-Channel Communication in a Multi-Channel Digital Hearing Instrument, U.S. patent application No. [application number not yet assigned], filed Apr. 18, 2002. These prior applications, including the entire written descriptions and drawing figures, are hereby incorporated into the present application by reference.

BACKGROUND

1. Field of the Invention

This invention generally relates to sound processing. More specifically, the invention provides a computationally efficient method of estimating the root-mean-square ("RMS") content of a spectrally complex signal.

2. Description of the Related Art

The human ear gauges the loudness of a signal based upon its RMS content. Traditionally, the RMS content of a spectrally complex signal is calculated by computing the square root of the mean of the squared signal being processed. The square root calculation, however, is processor intensive, and thus places a heavy burden on miniaturized sound processing devices, such as digital hearing instruments.

SUMMARY

A digital quasi-RMS detector is provided that approximates the time-varying RMS energy of a signal. The digital quasi-RMS detector rectifies the signal and compares the rectified signal with an estimated present energy value of the audio signal. If the difference between the rectified signal and the estimated present energy value is not greater than zero, then the digital quasi-RMS detector multiplies the rectified signal by a first time constant to generate a first filtered signal and sums the first filtered signal with the estimated present energy value to determine the approximate RMS energy. If the difference between the rectified signal and the estimated present energy is greater than zero, however, then the digital quasi-RMS detector multiplies the rectified signal by a second time constant to generate a second filtered signal and sums the second filtered signal with the estimated present energy value to determine the approximate RMS energy.

DETAILED DESCRIPTION

Figure 1A:
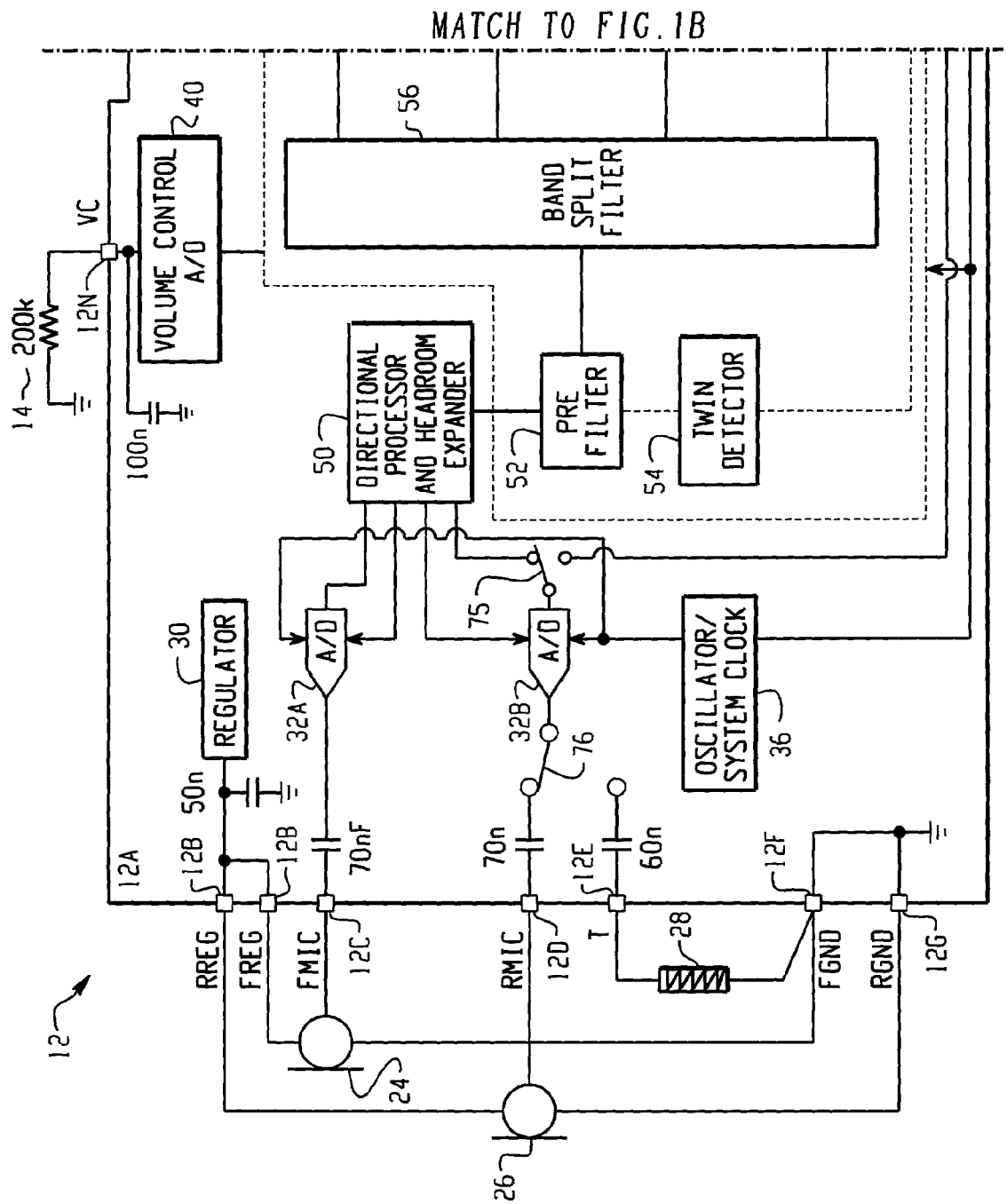
FIG. 1 is a block diagram of an exemplary digital hearing aid system according to the present invention.
Figure 1B:
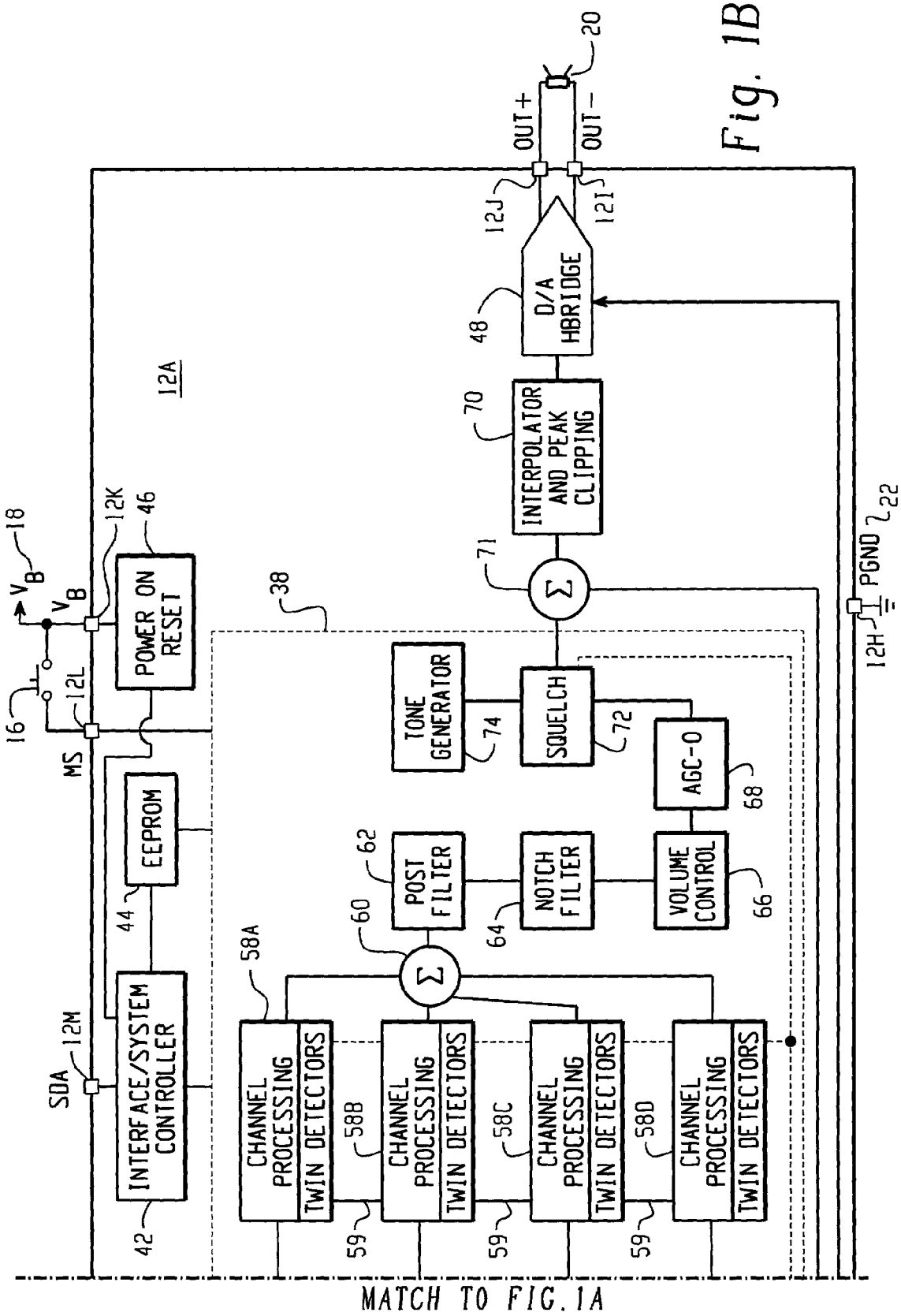

Turning now to the drawing figures, FIG. 1 is a block diagram of an exemplary digital hearing aid system 12. The digital hearing aid system 12 includes several external components 14, 16, 18, 20, 22, 24, 26, 28, and, preferably, a single integrated circuit (IC) 12A. The external components include a pair of microphones 24, 26, a tele-coil 28, a volume control potentiometer 24, a memory-select toggle switch 16, battery terminals 18, 22, and a speaker 20.

Sound is received by the pair of microphones 24, 26, and converted into electrical signals that are coupled to the FMIC 12C and RMIC 12D inputs to the IC 12A. FMIC refers to "front microphone," and RMIC refers to "rear microphone." The microphones 24, 26 are biased between a regulated voltage output from the RREG and FREG pins 12B, and the ground nodes FGND 12F and RGND 12G. The regulated voltage output on FREG and RREG is generated internally to the IC 12A by regulator 30.

The tele-coil 28 is a device used in a hearing aid that magnetically couples to a telephone handset and produces an input current that is proportional to the telephone signal. This input current from the tele-coil 28 is coupled into the rear microphone A/D converter 32B on the IC 12A when the switch 76 is connected to the "T" input pin 12E, indicating that the user of the hearing aid is talking on a telephone. The tele-coil 28 is used to prevent acoustic feedback into the system when talking on the telephone.

The volume control potentiometer 14 is coupled to the volume control input 12N of the IC. This variable resistor is used to set the volume sensitivity of the digital hearing aid.

The memory-select toggle switch 16 is coupled between the positive voltage supply VB 18 and the memory-select input pin 12L. This switch 16 is used to toggle the digital hearing aid system 12 between a series of setup configurations. For example, the device may have been previously programmed for a variety of environmental settings, such as quiet listening, listening to music, a noisy setting, etc. For each of these settings, the system parameters of the IC 12A may have been optimally configured for the particular user. By repeatedly pressing the toggle switch 16, the user may then toggle through the various configurations stored in the read-only memory 44 of the IC 12A.

The battery terminals 12K, 12H of the IC 12A are preferably coupled to a single 1.3 volt zinc-air battery. This battery provides the primary power source for the digital hearing aid system.

The last external component is the speaker 20. This element is coupled to the differential outputs at pins 12J, 12I of the IC 12A, and converts the processed digital input signals from the two microphones 24, 26 into an audible signal for the user of the digital hearing aid system 12.

There are many circuit blocks within the IC 12A. Primary sound processing within the system is carried out by a sound processor 38 and a directional processor and headroom expander 50. A pair of A/D converters 32A, 32B are coupled between the front and rear microphones 24, 26, and the directional processor and headroom expander 50, and convert the analog input signals into the digital domain for digital processing. A single D/A converter 48 converts the processed digital signals back into the analog domain for output by the speaker 20. Other system elements include a regulator 30, a volume control A/D 40, an interface/system controller 42, an EEPROM memory 44, a power-on reset circuit 46, a oscillator/system clock 36, a summer 71, and an interpolator and peak clipping circuit 70.

The sound processor 38 preferably includes a pre-filter 52, a wide-band twin detector 54, a band-split filter 56, a plurality of narrow-band channel processing and twin detectors 58A–58D, a summation block 60, a post filter 62, a notch filter 64, a volume control circuit 66, an automatic gain control output circuit 68, a squelch circuit 72, and a tone generator 74.

Operationally, the digital hearing aid system 12 processes digital sound as follows. Analog audio signals picked up by the front and rear microphones 24, 26 are coupled to the front and rear A/D converters 32A, 32B, which are preferably Sigma-Delta modulators followed by decimation filters that convert the analog audio inputs from the two microphones into equivalent digital audio signals. Note that when a user of the digital hearing aid system is talking on the telephone, the rear A/D converter 32B is coupled to the tele-coil input "T" 12E via switch 76. Both the front and rear A/D converters 32A, 32B are clocked with the output clock signal from the oscillator/system clock 36 (discussed in more detail below). This same output clock signal is also coupled to the sound processor 38 and the D/A converter 48.

The front and rear digital sound signals from the two A/D converters 32A, 32B are coupled to the directional processor and headroom expander 50. The rear A/D converter 32B is coupled to the processor 50 through switch 75. In a first position, the switch 75 couples the digital output of the rear A/D converter 32 B to the processor 50, and in a second position, the switch 75 couples the digital output of the rear A/D converter 32B to summation block 71 for the purpose of compensating for occlusion.

Occlusion is the amplification of the users own voice within the ear canal. The rear microphone can be moved inside the ear canal to receive this unwanted signal created by the occlusion effect. The occlusion effect is usually reduced by putting a mechanical vent in the hearing aid. This vent, however, can cause an oscillation problem as the speaker signal feeds back to the microphone(s) through the vent aperture. Another problem associated with traditional venting is a reduced low frequency response (leading to reduced sound quality). Yet another limitation occurs when the direct coupling of ambient sounds results in poor directional performance, particularly in the low frequencies. The system shown in FIG. 1 solves these problems by canceling the unwanted signal received by the rear microphone 26 by feeding back the rear signal from the A/D converter 32B to summation circuit 71. The summation circuit 71 then subtracts the unwanted signal from the processed composite signal to thereby compensate for the occlusion effect.

The directional processor and headroom expander 50 includes a combination of filtering and delay elements that, when applied to the two digital input signals, form a single, directionally-sensitive response. This directionally-sensitive response is generated such that the gain of the directional processor 50 will be a maximum value for sounds coming from the front microphone 24 and will be a minimum value for sounds coming from the rear microphone 26.

The headroom expander portion of the processor 50 significantly extends the dynamic range of the A/D conversion, which is very important for high fidelity audio signal processing. It does this by dynamically adjusting the operating points of the A/D converters 32A/32B. The headroom expander 50 adjusts the gain before and after the A/D conversion so that the total gain remains unchanged, but the intrinsic dynamic range of the A/D converter block 32A/32B is optimized to the level of the signal being processed.

The output from the directional processor and headroom expander 50 is coupled to the pre-filter 52 in the sound processor 38, which is a general-purpose filter for pre-conditioning the sound signal prior to any further signal processing steps. This "pre-conditioning" can take many forms, and, in combination with corresponding "post-conditioning" in the post filter 62, can be used to generate special effects that may be suited to only a particular class of users. For example, the pre-filter 52 could be configured to mimic the transfer function of the user's middle ear, effectively putting the sound signal into the "cochlear domain." Signal processing algorithms to correct a hearing impairment based on, for example, inner hair cell loss and outer hair cell loss, could be applied by the sound processor 38. Subsequently, the post-filter 62 could be configured with the inverse response of the pre-filter 52 in order to convert the sound signal back into the "acoustic domain" from the "cochlear domain." Of course, other pre-conditioning/post-conditioning configurations and corresponding signal processing algorithms could be utilized.

The pre-conditioned digital sound signal is then coupled to the band-split filter 56, which preferably includes a bank of filters with variable corner frequencies and pass-band gains. These filters are used to split the single input signal into four distinct frequency bands. The four output signals from the band-split filter 56 are preferably in-phase so that when they are summed together in summation block 60, after channel processing, nulls or peaks in the composite signal (from the summation block) are minimized.

Channel processing of the four distinct frequency bands from the band-split filter 56 is accomplished by a plurality of channel processing/twin detector blocks 58A–58D. Although four blocks are shown in FIG. 1, it should be clear that more than four (or less than four) frequency bands could be generated in the band-split filter 56, and thus more or less than four channel processing/twin detector blocks 58 may be utilized with the system.

Each of the channel processing/twin detectors 58A–58D provide an automatic gain control ("AGC") function that provides compression and gain on the particular frequency band (channel) being processed. Compression of the channel signals permits quieter sounds to be amplified at a higher gain than louder sounds, for which the gain is compressed. In this manner, the user of the system can hear the full range of sounds since the circuits 58A–58D compress the full range of normal hearing into the reduced dynamic range of the individual user as a function of the individual user's hearing loss within the particular frequency band of the channel.

The channel processing blocks 58A–58D can be configured to employ a twin detector average detection scheme while compressing the input signals. This twin detection scheme includes both slow and fast attack/release tracking modules that allow for fast response to transients (in the fast tracking module), while preventing annoying pumping of the input signal (in the slow tracking module) that only a fast time constant would produce. The outputs of the fast and slow tracking modules are compared, and the compression parameters are then adjusted accordingly. The compression ratio, channel gain, lower and upper thresholds (return to linear point), and the fast and slow time constants (of the fast and slow tracking modules) can be independently programmed and saved in memory 44 for each of the plurality of channel processing blocks 58A–58D.

FIG. 1 also shows a communication bus 59, which may include one or more connections for coupling the plurality of channel processing blocks 58A–58D. This inter-channel communication bus 59 can be used to communicate information between the plurality of channel processing blocks 58A–58D such that each channel (frequency band) can take into account the "energy" level (or some other measure) from the other channel processing blocks. Preferably, each channel processing block 58A–58D would take into account the "energy" level from the higher frequency channels. In addition, the "energy" level from the wide-band detector 54 may be used by each of the relatively narrow-band channel processing blocks 58A–58D when processing their individual input signals.

After channel processing is complete, the four channel signals are summed by summation bock 60 to form a composite signal. This composite signal is then coupled to the post-filter 62, which may apply a post-processing filter function as discussed above. Following post-processing, the composite signal is then applied to a notch-filter 64, that attenuates a narrow band of frequencies that is adjustable in the frequency range where hearing aids tend to oscillate. This notch filter 64 is used to reduce feedback and prevent unwanted "whistling" of the device. Preferably, the notch filter 64 may include a dynamic transfer function that changes the depth of the notch based upon the magnitude of the input signal.

Following the notch filter 64, the composite signal is coupled to a volume control circuit 66. The volume control circuit 66 receives a digital value from the volume control A/D 40, which indicates the desired volume level set by the user via potentiometer 14, and uses this stored digital value to set the gain of an included amplifier circuit.

From the volume control circuit, the composite signal is coupled to the AGC-output block 68. The AGC-output circuit 68 is a high compression ratio, low distortion limiter that is used to prevent pathological signals from causing large scale distorted output signals from the speaker 20 that could be painful and annoying to the user of the device. The composite signal is coupled from the AGC-output circuit 68 to a squelch circuit 72, that performs an expansion on low-level signals below an adjustable threshold. The squelch circuit 72 uses an output signal from the wide-band detector 54 for this purpose. The expansion of the low-level signals attenuates noise from the microphones and other circuits when the input S/N ratio is small, thus producing a lower noise signal during quiet situations. Also shown coupled to the squelch circuit 72 is a tone generator block 74, which is included for calibration and testing of the system.

The output of the squelch circuit 72 is coupled to one input of summation block 71. The other input to the summation bock 71 is from the output of the rear A/D converter 32B, when the switch 75 is in the second position. These two signals are summed in summation block 71, and passed along to the interpolator and peak clipping circuit 70. This circuit 70 also operates on pathological signals, but it operates almost instantaneously to large peak signals and is high distortion limiting. The interpolator shifts the signal up in frequency as part of the D/A process and then the signal is clipped so that the distortion products do not alias back into the baseband frequency range.

The output of the interpolator and peak clipping circuit 70 is coupled from the sound processor 38 to the D/A H-Bridge 48. This circuit 48 converts the digital representation of the input sound signals to a pulse density modulated representation with complimentary outputs. These outputs are coupled off-chip through outputs 12J, 12I to the speaker 20, which low-pass filters the outputs and produces an acoustic analog of the output signals. The D/A H-Bridge 48 includes an interpolator, a digital Delta-Sigma modulator, and an H-Bridge output stage. The D/A H-Bridge 48 is also coupled to and receives the clock signal from the oscillator/system clock 36 (described below).

The interface/system controller 42 is coupled between a serial data interface pin 12M on the IC 12, and the sound processor 38. This interface is used to communicate with an external controller for the purpose of setting the parameters of the system. These parameters can be stored on-chip in the EEPROM 44. If a "black-out" or "brown-out" condition occurs, then the power-on reset circuit 46 can be used to signal the interface/system controller 42 to configure the system into a known state. Such a condition can occur, for example, if the battery fails.

In audio processing applications, such as the digital hearing aid instrument shown in FIG. 1, it is desirable that the system be able to estimate (or calculate) the root-mean-square (RMS) value of the input audio signal. This is important because the human ear gauges the loudness of an audio signal according to its RMS power. This RMS calculation may be performed in the wideband twin detector 54, the narrowband twin detectors 58A–58D, and the AGC-O block 68. Calculating the RMS value of a spectrally complex signal is problematic, however, because of the processing power required to compute the square root component of the RMS calculation. The present invention overcomes this problem by estimating the RMS calculation using a quasi-RMS detector. The quasi-RMS detector may be implemented in blocks 54, 58A–58D and 68, and comprises a hybrid of an average detector with a peak detector to thereby avoid making the square root calculation.

An average detector can be implemented using rectification of an AC signal followed by low-pass filtering. The rectifier converts the AC signal into a DC component and an AC component. Low-pass filtering smoothes the rectified waveform by attenuating the AC component and leaving the DC component intact. The magnitude of the DC component is proportional to the amplitude of the original signal, and is therefore useful for metering applications. The low-pass filter can be thought of as a "leaky integrator." In addition to smoothing the AC component, the average detector also responds gradually to changes in the magnitude of the original signal, meaning that the DC component actually waxes and wanes with a time constant inversely proportional to the frequency of the filter's pole. If the original signal is periodic and of constant amplitude, the output of the low-pass filter is directly proportional to the arithmetic mean of one complete cycle of the rectified waveform.

Simple mathematical analysis, however, shows that an average detector underestimates the true RMS content of a periodic signal having a peak-to-RMS ratio greater than 1, and that this error increases as the peak-to-RMS ratio increases. Therefore, in audio metering applications, an average detector alone will not provide an accurate estimate of the true RMS content of a speech-like signal. In applications where signal-processing decision thresholds are meant to correspond to the ranges of human hearing, these thresholds will be in error.

A peak detector can be implemented by augmenting the average detector described above as follows. If the amplitude of the rectified signal exceeds that at the output of the low-pass filter, the rectified signal is passed directly to the peak detector's output. If the amplitude of the rectified signal is less than that at the output of the low-pass filter, then the low-pass filter output is passed directly to the peak detector's output. The effect of this modification is to force the detector output to respond instantaneously to sudden increases in amplitude of the incoming signal, and to decay with the inherent time constant of the low-pass filter whenever the amplitude of the incoming signal suddenly drops.

In terms of speech-like audio signals, a peak detector will over-estimate the RMS content, and once again, in applications where signal-processing decision thresholds are meant to correspond to the ranges of human hearing, these thresholds will be in error. Thus, neither an average detector nor a peak detector, alone, can accurately estimate the true RMS content of a signal.

A quasi-RMS detection algorithm falls somewhere between average detection and peak detection. A quasi-RMS detector can be implemented by augmenting the peak detector described above as follows. If the amplitude of the rectified signal exceeds the detector's present output level, then the low-pass filter's time constant is reduced. If the amplitude of the rectified signal is less than the detector's present output level, then the low-pass filter's time constant is increased. As the detector responds to a fluctuating input signal, its low-pass filter time constant adaptively switches between two preset values. The effect of this modification is to force the detector output to respond quickly, but not instantaneously, to sudden increases in amplitude of the incoming signal using the smaller of the two filter time constants. This is defined as the detector's attack time constant. Sudden decreases in signal amplitude invoke the slower filter time constant, which now governs the detector's response time. This is defined as the detector's release time.

Figure 2:
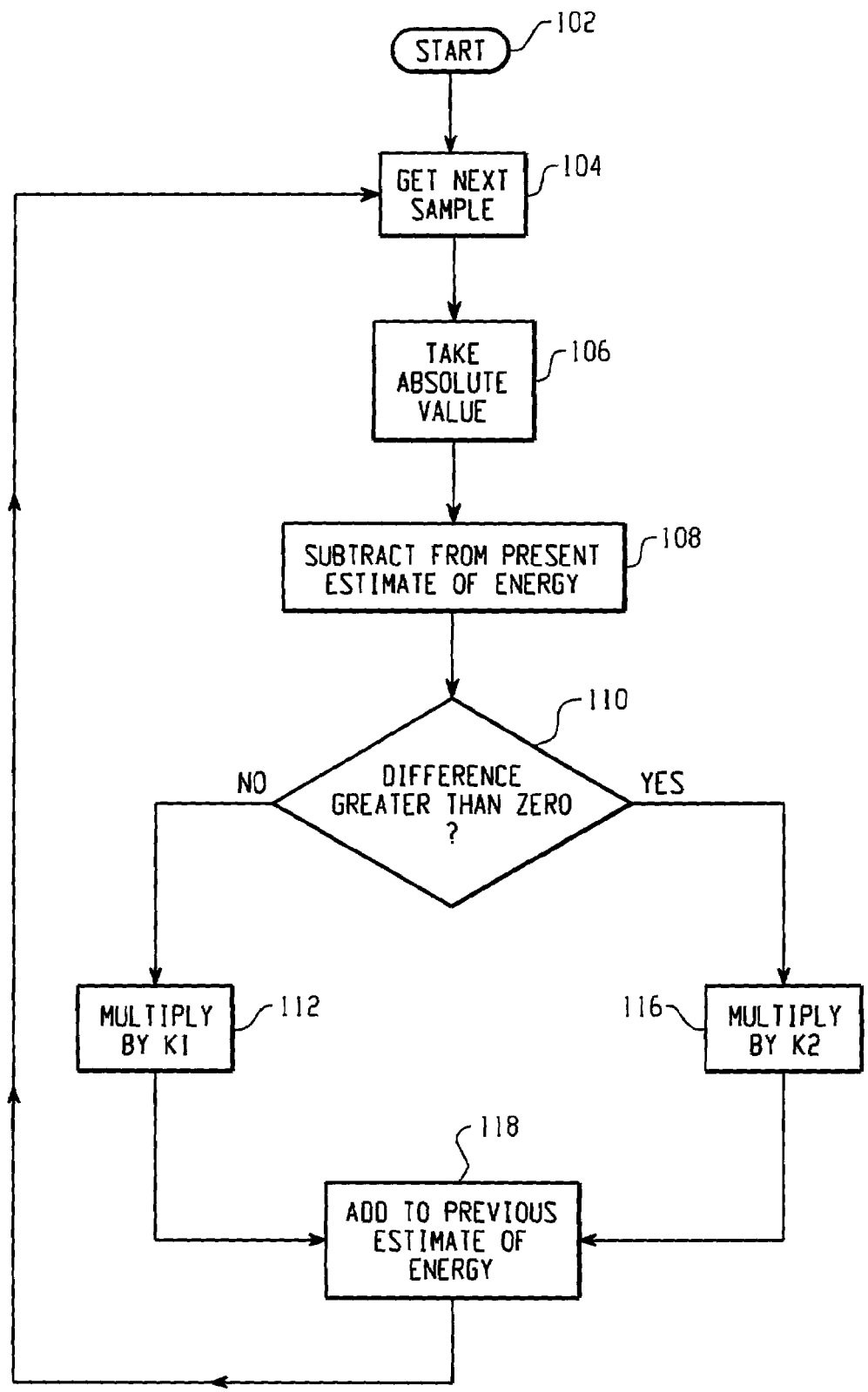
FIG. 2 is a flowchart depicting an exemplary method for estimating the RMS energy of a spectrally complex signal.

FIG. 2 is a flowchart 100 depicting an exemplary method for estimating the RMS energy of a spectrally complex signal using the quasi-RMS detector described above. This is a software implementation of the quasi-RMS detector. It should be understood, however, that these software method steps could also be implemented in a hardware circuit.

The method begins at step 102. At step 104, the next sample in the spectrally complex signal to be measured is obtained. The sample is then rectified (by taking the absolute value of the sample) at step 106. The rectified sample is then subtracted from a running, present estimate of the signal energy to obtain a difference value "DIFF" at step 108. At step 110, the method determines whether the DIFF function is greater than zero. If it is not, then the DIFF value is multiplied by a release time constant K1 at step 112. If the DIFF function is greater than zero, then the DIFF value is multiplied by an attack time constant K2 at step 116. The result of the multiplication from step 112 or 116 is summed with the previous, running estimate of the signal energy at step 118 to generate an estimated RMS value. Steps 112, 116 and 118 thus result in a low-pass filter with an adaptively switching time constant. After filtering, control passes back to step 104 to obtain the next sample of the complex signal.

The release time constant K1 is equal to 1/(sampling frequency*programmable time constant). The sampling frequency could be, for example, 32 KHz, and the programmable time constant could be 4 mSec, giving a K1 value of $\frac{1}{128}$. In the digital domain, multiplying by this $\frac{1}{128}$ K value can be easily implemented in a binary shift register by shifting right by 7 register positions, which is a very efficient operation.

The attack time constant K2 is equal to $\frac{1}{4}$ times the release time constant K1, which implements an RMS energy level detector. If K2 were equal to 1, then the low-pass filter would be operating as a peak detector, and if K2 were equal to K1, then the filter would be operating as an average detector. In the digital domain, the multiplication function in step 116 is then easily implemented by shifting right by 5 bit positions in a shift register operation. Thus, using the quasi-RMS algorithm described above, an estimate of the RMS content of a complex signal can be obtained without any complex square root, division, or even multiplication functions.

Heuristically, it is found that a quasi-RMS detector as described above gives good agreement with the response of a true RMS detector to speech-like signals when its attack time constant is approximately one quarter of its release time constant. Fine tuning of the residual error is afforded by adjusting one of the two time constants. Overall response time can then be adjusted without destroying the quasi-RMS behavior by scaling both time constants up or down while preserving their mutual ratio. This accuracy is obtained with substantially no more complexity than a peak detector or average detector, involving rectification and linear filtering. The algorithmic complexity is much lower than a true RMS detector, which requires a hardware-intensive means for exponentiation in addition to linear filtering.

Figure 3:
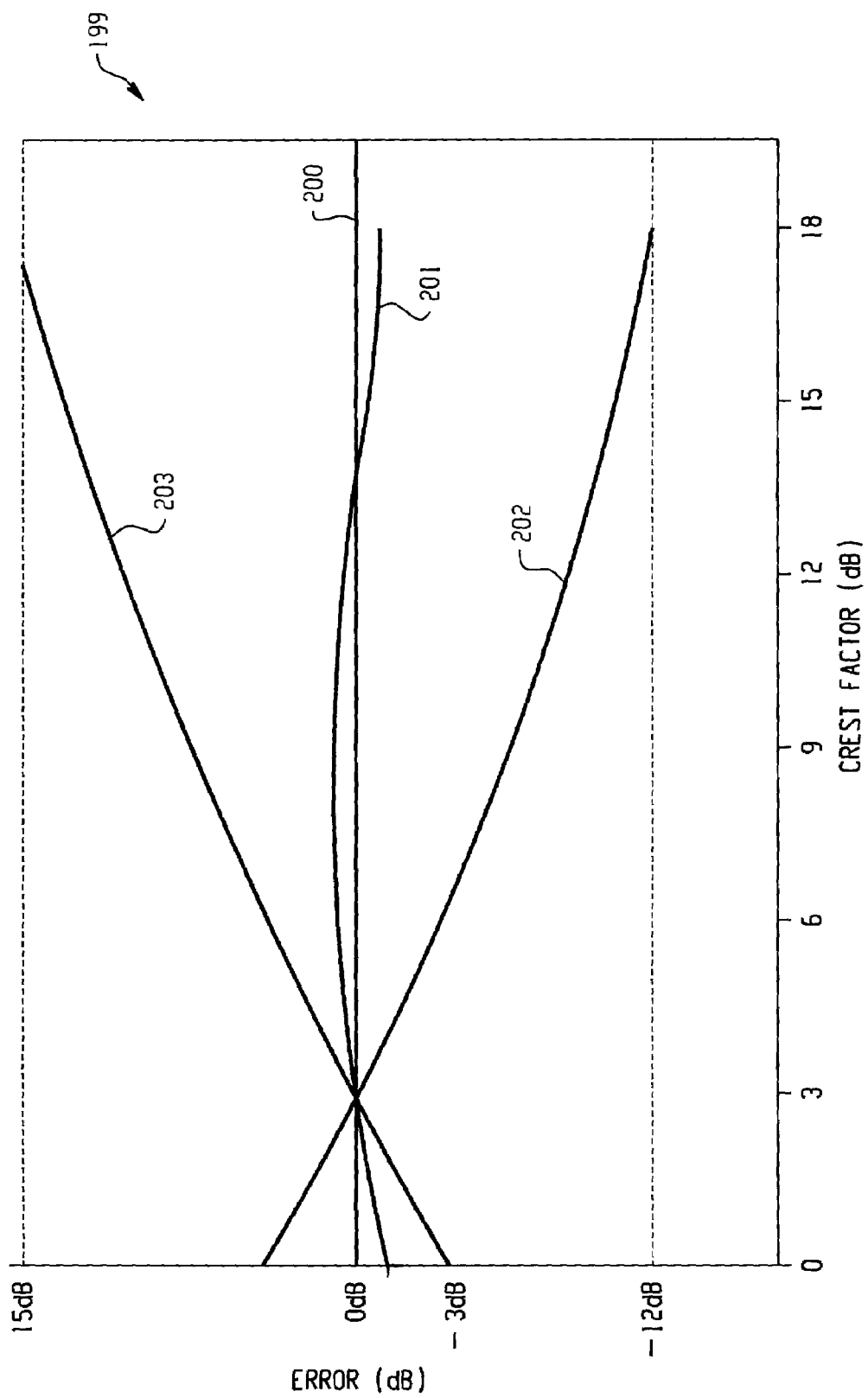
FIG. 3 is a graph illustrating the performance of an exemplary quasi-RMS detector compared to a typical average detector and a typical peak detector.

FIG. 3 is a graph 199 illustrating the performance of an exemplary quasi-RMS detector 201 compared to a typical average detector 202 and a typical peak detector 203. The x-axis of the graph 199 represents a range of crest factors (peak to RMS ratios). For example, a square wave may have a 0 dB crest factor, a speech signal may have a 12 dB crest factor, and a highly peaky signal may have an 18 dB crest factor. The y-axis of the graph 199 represents the error (in dB) exhibited by the exemplary RMS detectors 201, 202, 203 over the range of crest factors. Also illustrated is a performance curve for an ideal RMS meter 200 which exhibits a 0 dB error over the range of crest factors.

The range of crest factors over which an RMS detector 201, 202, 203 can estimate an RMS value for a complex waveform that is close to the true RMS value (0 dB error) is a good indication of performance. The exemplary quasi-RMS detector 201 may estimate RMS values that remain within 1 dB of true RMS over the entire range of low crest factor signals. The average detector 202, however, may vary from true RMS by 12 dB, and the peak detector 203 may vary by 15 dB. It should be understood, however, that the error values shown in FIG. 3 are provided for illustrative purposes only, and are not intended as a limitation on the performance of the quasi-RMS detector.

This written description uses examples to disclose the invention, including the best mode, and also to enable any person skilled in the art to make and use the invention. The patentable scope of the invention is defined by the claims, and may include other examples that occur to those skilled in the art.

I claim:

1. A method of approximating a root-mean-square (RMS) value for an audio signal in a digital hearing aid, comprising the steps of:
   receiving the audio signal;
   rectifying the audio signal to generate a rectified signal;
   determining a difference between the rectified signal and an estimated present energy value of the audio signal;
   if the difference is not greater than zero, then multiplying the rectified signal by a release time constant to generate a first filtered signal and summing the first filtered signal with the estimated present energy value to determine the approximate RMS value; and
   if the difference is greater than zero, then multiplying the rectified signal by an attack time constant to generate a second filtered signal and summing the second filtered signal with the estimated present energy value to determine the approximate RMS value; wherein the attack time constant is less than the release time constant.

2. The method of claim 1, wherein the attack time constant is a fraction of the release time constant.

3. The method of claim 1, comprising the additional step of:
    setting the estimated present energy value to the approximate RMS value.

4. The method of claim 1, comprising the additional step of:
    prior to the rectifying step, sampling the audio signal to generate a sampled audio signal, wherein the sampled audio signal is rectified to generate the rectified signal.

5. A method of approximating a root-mean-square (RMS) value for an audio signal in a digital hearing instrument, comprising the steps of:
    receiving the audio signal;
    rectifying the audio signal to generate a rectified signal;
    determining a difference between the rectified signal and an estimated present energy value of the audio signal;
    generating a filtered audio signal by shifting a binary representation of the rectified signal in relation to the difference between the rectified signal and the estimated present energy value of the audio signal; and
    summing the filtered audio signal with the estimated present energy value to determine the approximate RMS value.

6. The method of claim 5, comprising the additional step of:
    setting the estimated present energy value to the approximate RMS value.

7. The method of claim 5, wherein if the difference is greater than zero (0), then generating the filtered audio signal by shifting the binary representation of the rectified signal to the right by a predetermined number of register positions.

8. The method of claim 7, wherein the binary representation of the rectified signal is shifted right by two register positions.

9. The method of claim 5, wherein:
    if the difference is greater than zero (0), then generating the filtered audio signal by shifting the binary representation of the rectified signal to the right by a first number of register positions; and
    if the difference is not greater than zero (0), then generating the filtered audio signal by shifting the binary representation of the rectified signal to the right by a second number of register positions.

10. The method of claim 9, wherein the second number of register positions is greater than the first number of register positions.

11. The method of claim 10, wherein the first number of register positions is five (5) and the second number of register positions is seven (7).

12. A digital hearing instrument, comprising:
    a microphone that receives an acoustical signal and generates a wideband audio signal;
    a band-split filter coupled to the microphone that filters the wideband audio signal into a plurality of channel audio signals;
    means for rectifying each channel audio signal to generate a rectified signal;
    means for determining a difference between each rectified signal and an estimated present energy value for each corresponding channel audio signal;
    means for shifting a binary representation of each rectified signal in relation to the difference between the rectified signal and the estimated present energy value of the corresponding channel audio signal to generate a filtered audio signal for each rectified signal;
    means for summing each filtered audio signal with the corresponding estimated present energy value to determine an approximate energy value for each channel audio signal;
    a plurality of channel processors coupled to the band-split filter that amplify each of the channel audio signals by a channel gain to generate a conditioned channel signal, wherein the channel gain for each channel audio signal is determined as a function of the approximate energy value for the channel audio signal;
    a summation circuit coupled to the plurality of channel processors that sums the conditioned channel signals from the channel processors and generates a composite signal; and
    a speaker coupled to the summation circuit that receives the composite signal and generates an acoustical output signal.

13. The digital hearing instrument of claim 12, wherein the channel gain for at least one channel audio signal is determined as a function of the approximate energy value for the one channel audio signal and the approximate energy value for one other channel audio signal.

14. The digital hearing instrument of claim 12, further comprising:
    means for setting the estimated present energy value for each channel audio signal to the approximate energy value for the corresponding channel audio signal.

15. The digital hearing instrument of claim 12, wherein if the difference between any rectified signal and the estimated present energy value for the corresponding channel audio signal is greater than zero (0), then the shifting means shifts the binary representation of the rectified signal to the right by a predetermined number of register positions.

16. The digital hearing instrument of claim 15, wherein the binary representation of the rectified signal is shifted to the right by two resister positions.

17. The digital hearing instrument of claim 12, wherein:
    if the difference between any rectified signal and the estimated present energy value for the corresponding channel audio signal is greater than zero (0), then the shifting means shifts the binary representation of the rectified signal to the right by a first number of register positions; and
    if the difference between any rectified signal and the estimated present energy value for the corresponding channel audio signal is not greater than zero (0), then the shifting means shifts the binary representation of the rectified signal to the right by a second number of register positions.

18. The digital hearing instrument of claim 17, wherein the second number of register positions is greater than the first number of register positions.

19. The digital hearing instrument of claim 18, wherein the first number of register positions is five (5) and the second number of register positions is seven (7).

20. A digital hearing instrument, comprising:
    a microphone that receives an acoustical signal and generates a wideband audio signal;
    a band-split filter coupled to the microphone that filters the wideband audio signal into a plurality of channel audio signals;
    means for rectifying each channel audio signal to generate a rectified signal;

means for determining a difference between each rectified signal and an estimated present energy value for each corresponding channel audio signal;

means for multiplying each rectified signal by a release time constant if the difference between the rectified signal and the estimated present energy value for the corresponding channel audio signal is not greater than zero to generate a filtered channel signal, and for multiplying each rectified signal by an attack time constant if the difference between the rectified signal and the estimated present energy value for the corresponding channel audio signal is greater than zero to generate the filtered channel signal;

means for summing each filtered channel signal with the corresponding estimated present energy value to determine an approximate energy value for each channel audio signal;

a plurality of channel processors coupled to the band-split filter that amplify each of the channel audio signals by a channel gain to generate a conditioned channel signal, wherein the channel gain for each channel audio signal is determined as a function of the approximate energy value for the channel audio signal;

a summation circuit coupled to the plurality of channel processors that sums the conditioned channel signals from the channel processors and generates a composite signal; and a speaker coupled to the summation circuit that receives the composite signal and generates an acoustical output signal.

21. A digital hearing instrument, comprising:

a microphone that receives an acoustical signal and generates a wideband audio signal;

a band-split filter coupled to the microphone that filters the wideband audio signal into a plurality of channel audio signals;

a plurality of twin detectors that determine an estimated energy level for each of the channel audio signals by rectifying each channel audio signal to generate a rectified signal, determining a difference between each rectified signal and an estimated a present energy value for each corresponding channel audio signal, generating a filtered audio signal for each rectified signal by shifting a binary representation of the rectified signal in relation to the difference between the rectified signal and the estimated present energy value of the corresponding channel audio signal, and summing each filtered audio signal with the corresponding estimated present energy value;

a plurality of channel processors coupled to the band-split filter and the twin detectors that amplify each of the channel audio signals by a channel gain to generate a conditioned channel signal, wherein the channel gain for each channel audio signal is determined as a function of the approximate energy value for the channel audio signal;

a summation circuit coupled to the plurality of channel processors that sums the conditioned channel signals from the channel processors and generates a composite signal; and a speaker coupled to the summation circuit that receives the composite signal and generates an acoustical output signal.

* * * * *